(12) United States Patent
Furo et al.

(10) Patent No.: US 7,276,292 B2
(45) Date of Patent: Oct. 2, 2007

(54) INSULATING SUBSTRATE BOARDS FOR SEMICONDUCTOR AND POWER MODULES

(75) Inventors: Masahiro Furo, Tokyo (JP); Hideyo Osanai, Tokyo (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 10/087,566

(22) Filed: Mar. 1, 2002

(65) Prior Publication Data

US 2002/0164488 A1   Nov. 7, 2002

(30) Foreign Application Priority Data

Mar. 1, 2001  (JP) ............... 2001-056106
Jan. 25, 2002  (JP) ............... 2002-016579

(51) Int. Cl.
*B32B 15/20* (2006.01)
*B32B 15/04* (2006.01)
*H01L 23/00* (2006.01)

(52) U.S. Cl. ............ 428/469; 428/688; 428/689; 428/699; 428/620; 428/621; 428/650

(58) Field of Classification Search ......... 428/209, 428/210, 446, 469, 689, 698, 699, 704; 257/501; 420/542, 546, 548, 553; 361/808, 760, 767, 361/771
See application file for complete search history.

(56) References Cited

U.S. PATENT DOCUMENTS 3,994,430 A    11/1976  Cusano et al.
4,222,774 A *   9/1980  Boutin et al. ............. 75/148
5,213,877 A *   5/1993  Yoshida et al. ............ 428/209
5,707,715 A     1/1998  deRochemont et al.
5,807,626 A     9/1998  Naba
5,965,193 A *  10/1999  Ning et al. .............. 427/126.4
6,033,787 A     3/2000  Nagase et al.
6,122,170 A *   9/2000  Hirose et al. ............. 361/704

(Continued)

FOREIGN PATENT DOCUMENTS

EP    0598582 A1    3/1989

(Continued)

*Primary Examiner*—Jennifer C. McNeil
*Assistant Examiner*—Jason L. Savage
(74) *Attorney, Agent, or Firm*—Patterson, Thuente, Skaar & Christensen, P.A.

(57) ABSTRACT

An insulating substrate board for a semiconductor of the present invention comprises a ceramic substrate board (2) and a metal alloy layer (3) consisting of aluminum formed on one surface portion of the ceramic substrate board (2), wherein the Vickers hardness of the metal alloy layer (3) is not less than 25 and not more than 40. The metal alloy layer (3) includes silicon of not less than 0.2% by weight and not more than 5% by weight. The ceramic substrate board (2) is made of a material selected from a group consisting of alumina, aluminum nitride, and silicon nitride. A power module of the present invention comprises a metal base plate (7), a ceramic substrate board (2), one surface of which is bonded to the metal base plate (7), and the other surface of which is bonded on a semiconductor tip (1), at least one surface portion of the ceramic substrate board (2) having a metal alloy layer (3) consisting of aluminum, wherein the Vickers hardness of the metal alloy layer (3) is not less than 25 and not more than 40.

38 Claims, 1 Drawing Sheet

U.S. PATENT DOCUMENTS

| | | | | |
|---|---|---|---|---|
| 6,153,025 A | * | 11/2000 | Auran et al. | 148/437 |
| 6,297,549 B1 | * | 10/2001 | Hiyoshi | 257/703 |
| 2001/0017770 A1 | * | 8/2001 | Copetti et al. | 361/765 |

FOREIGN PATENT DOCUMENTS

| | | |
|---|---|---|
| EP | 1056321 A2 | 11/2000 |
| JP | 68448/90 A1 | 5/1990 |
| JP | 57945/91 A1 | 6/1991 |
| JP | 07193358 A1 | 7/1995 |
| JP | 07276035 A1 | 10/1995 |
| JP | 65296/1998 | 3/1998 |

* cited by examiner

INSULATING SUBSTRATE BOARDS FOR SEMICONDUCTOR AND POWER MODULES

BACKGROUND OF THE INVENTION

1. Field of the Invention

The present invention relates to an insulating substrate board for a semiconductor and a power module and, more particularly, relates to a metal-ceramic circuit substrate board having a high heat-cycle resistance, which is suitable for the installation of high power electronic parts, such as power modules, and a power module having the insulating substrate board.

2. Description of the Prior Art

Recently, high power modules have been used to control a heavy electric current of electric automobiles, electric cars, tooling machines or the like. The power modules have mainly a plurality of semiconductor tips. A high electric insulation performance is required for a substrate board to which the semiconductor tips are fixed, in order to obtain a large current from a front surface and a back surface of each semiconductor tip. Further, a temperature of the semiconductor tip is elevated by heat generated when a heavy current is passed through the semiconductor tip. Accordingly, a good heat transferability has been required for the substrate board on which the semiconductor tips are fixed, and parts surrounding the board. Furthermore, a high reliability and a durability have been required for the substrate board which is installed on the automobiles, electric cars or the like.

So-called thermal cycle test is normally carried out in order to know the reliability and durability of the substrate board. In such thermal cycle test, a thermal shock is applied on the substrate board by changing the temperature of the substrate board between the possible highest temperature and the possible lowest temperature within a short time, and any damage of the substrate board is investigated. In general, the substrate board for use in the automobiles or the electric cars is required to withstand the thermal cycle test of 1000 times.

Figure 1:
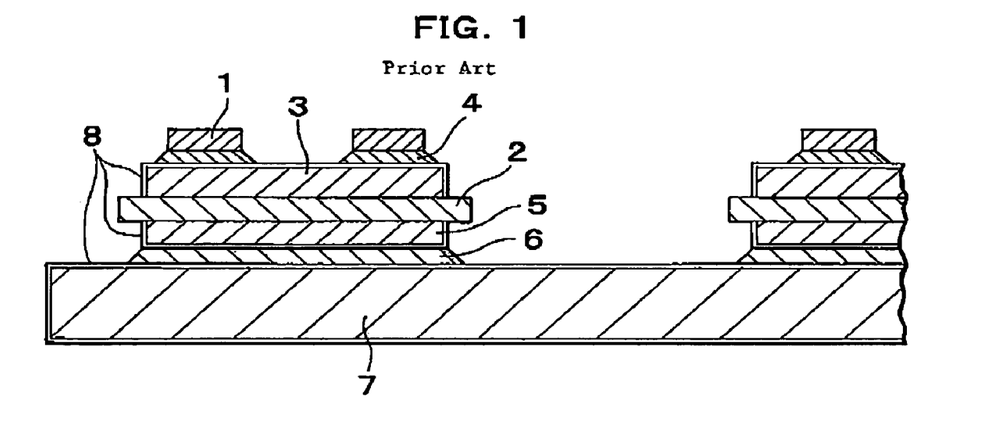
FIG. 1 is a vertically sectioned front view of a conventional power module.

FIG. 1 shows a conventional power module in section. The power module has semiconductor tips 1, brazing material layers 4, a metal layer 3, a ceramic substrate board 2 as an insulating substrate board, a metal layer 5, a brazing material layer 6, and a metal base plate 7 piled in this order. Reference numeral 8 denotes plating layers formed on the metal layers 3 and 5, and the metal base plate 7. Wirings between the semiconductor tips 1 are omitted in FIG. 1.

It is considered that an insulating substrate board consisting of a ceramic substrate board bonded to an aluminum plate may be suitable for a power module having a high reliability for use in the automobiles or the electric cars. In general, if the insulating substrate board consisting of a metal and ceramics is subjected to the thermal cycle test as mentioned above, a stress is generated on the boundary surface between the metal and the ceramics, because the metal is different in thermal expansion coefficient from the ceramics, so that the ceramic substrate board is broken finally. However, if the metal is aluminum, the evaluation of the thermal cycle may be enhanced remarkably compared with copper, because the aluminum is deformable so as to reduce the stress applied to the ceramics.

Heretofore, various methods have been proposed to bond an aluminum plate and a ceramic substrate board using a brazing material as shown in Japanese Unexamined Utility Model Publication No. 57945/1991 and Japanese Unexamined Utility Model Publication No. 68448/1990. Among these methods, an aluminum plate is bonded to an aluminum nitride board or an alumina board by using a brazing material of Al—Si series or Al—Ge series. U.S. Pat. No. 3,994,430, published on 1976, shows the use of silicon as an aluminum binding assistant. Further, Japanese Unexamined Patent Publications No. 193358/1995 and No. 276035/1955 disclose such a method that aluminum in molten state is contacted with a substrate board of aluminum nitride or an alumina substrate board, and the aluminum is solidified, so that the aluminum is bonded directly to the substrate board.

Further, Japanese Unexamined Patent Publications No. 193358/1995 and No. 276035/1955 disclose such a method that aluminum in molten state is contacted with a substrate board of aluminum nitride or an alumina substrate board, and the aluminum is solidified, so that the aluminum is bonded directly to the substrate board.

The insulating substrate board consisting of aluminum and ceramics is used for a power module by bonding semiconductor tips to the aluminum by using brazing materials. In such a case, the aluminum is held between the ceramics and the brazing materials with the semiconductor tips, and accordingly, the aluminum must have a role for protecting the ceramics and have a function to arrange the brazing materials and the semiconductor tips. Thus, an insulating substrate board which is not so affected by the thermal shock is required. Specifically, the heat transferability of the power module is reduced remarkably by the cracks formed due to the thermal shock in the aluminum or the brazing material of the lead solder or in the boundary surface between the brazing material and the aluminum, so that the semiconductor is elevated in temperature and broken finally.

SUMMARY OF THE INVENTION

Therefore, an object of the present invention is to solve the above problems.

The present inventors have made various studies and found that the above task could be solved by setting a hardness of aluminum of an aluminum-ceramics insulating substrate board within a predetermined range.

Specifically, the inventors found a range of the hardness of aluminum of the insulating substrate board, within which the ceramics was protected from the thermal shock and no crack was formed in the brazing material. The above range was not less than 25 and not more than 40 in Vickers hardness. If the Vickers hardness is not more than 25, the ceramics is protected from the thermal shock, however, the aluminum is deformed largely and cracks are formed easily in the brazing material when the thermal shock is applied repeatedly. If the Vickers hardness is not less than 40, the cracks are formed easily in the ceramics when the thermal shock is applied repeatedly, because the aluminum is hardly deformed and the thermal stress is hardly absorbed.

It is sufficient to add another metal element such as silicon to the aluminum in order to realize the above hardness of the predetermined range. Silicon is suitable, because it is diffused easily in the aluminum and it makes a eutectic at a low temperature. In order to realize the Vickers hardness of not less than 25 and not more than 40, silicon of not less than 0.2 weight % and not more than 5 weight % is required. It is possible to add further Mn, Mg or the like.

An insulating substrate board for a semiconductor according to the present invention is characterized by comprising a ceramic substrate board and a metal alloy layer consisting mainly of aluminum formed on at least one surface portion of the ceramic substrate board, wherein the Vickers hardness of the metal alloy layer is not less than 25 and not more than 40.

A power module according to the present invention is characterized by comprising a metal base plate, a ceramic substrate board, one surface of which is bonded to the metal base plate, and the other surface of which is bonded to a semiconductor tip, at least one surface portion of the ceramic substrate board having a metal alloy layer consisting mainly of aluminum, wherein the Vickers hardness of the metal alloy layer is not less than 25 and not more than 40.

The metal alloy layer includes silicon of not less than 0.2% by weight and not more than 5% by weight. The metal alloy layer includes Mn of not more than 1.5% by weight.

The metal alloy layer includes Mn of not more than 1.5% by weight.

The metal alloy layer includes Mg of not more than 1% by weight.

The ceramic substrate board is made of a material selected from a group consisting of alumina, aluminum nitride, and silicon nitride.

The metal alloy layer includes Cu, Zn or Ni of not less than 0.2% by weight and not more than 3% by weight.

These and other aspects and objects of the present invention will be better appreciated and understood when considered in conjunction with the following description and the accompanying drawings. It should be understood, however, that the following description, while indicating preferred embodiments of the present invention, is given by way of illustration and not of limitation. Many changes and modifications may be made within the scope of the present invention without departing from the spirit thereof, and the invention includes all such modifications.

DESCRIPTION OF THE PREFERRED EMBODIMENTS

EXAMPLE 1

Figure 2:
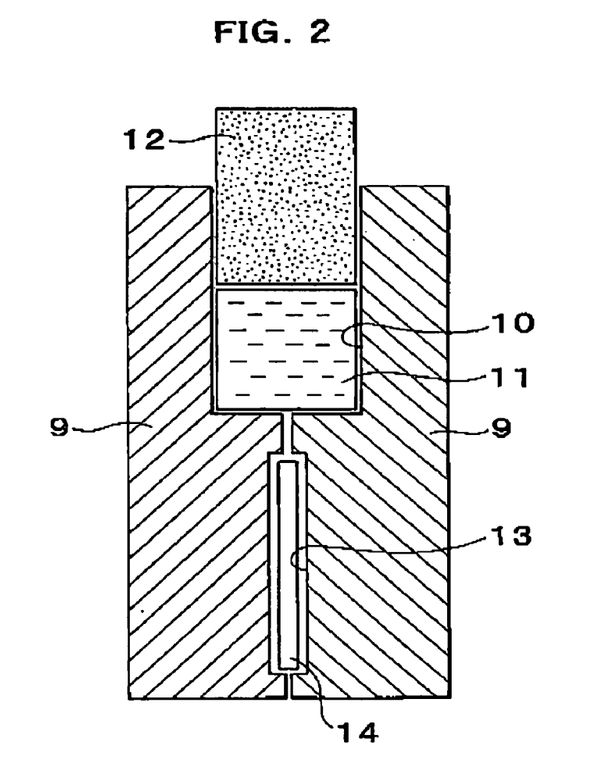
FIG. 2 is a vertically sectioned front view of a manufacturing device for making a substrate board in accordance with the present invention.

In a first example of the present invention, as shown in FIG. 2, a raw material 11 including aluminum of 99.8% by weight and silicon of 0.2% by weight were set in a concave portion 10 formed at an upper portion of a crucible 9 of graphite. The concave portion 10 was closed by a piston 12 of graphite. A ceramic substrate board 14 of aluminum nitride of 0.635 mm in Thickness was set in a cavity 13 formed at a lower portion of the crucible 9. Then, the crucible 9 was inserted into a furnace heated at 800° C. As a result, the raw material 11 was molten and pushed out by the weight of the piston 12 into the cavity 13 including therein the ceramic substrate board 14. The crucible 9 was taken out of the furnace and cooled at a room temperature. In this example 1, the heating and cooling of the crucible 9 were performed in an atmosphere of nitrogen gas in order to prevent the crucible 9 from being oxidized. Thus obtained ceramic substrate having at each of side surfaces thereof an aluminum alloy layer of 0.5 mm in thickness was subjected to the mechanical and electrolytic polishing.

The Vickers hardness of the aluminum alloy layer of the ceramic substrate board was 25. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 2

A metal-ceramic substrate board was formed under the same condition as in the example 1 except that the composition of the raw material 11 was formed of aluminum of 99% by weight and silicon of 0.5% by weight. The Vickers hardness of the aluminum alloy layer of the aluminum substrate board was 30. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 3

A metal-ceramic substrate board was formed under the same condition as in the example 1 except that the composition of the raw material 11 was formed of aluminum of 98% by weight and silicon of 2% by weight. The Vickers hardness of the aluminum alloy layer of the aluminum substrate board was 35. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 4

A metal-ceramic substrate board was formed under the same condition as in the example 2 except that alumina was used as the ceramics. The Vickers hardness of the aluminum alloy layer of the substrate board was 30. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 5

A metal-ceramic substrate board was formed under the same condition as in the example 2 except that silicon nitride was used as the ceramics. The Vickers hardness of the aluminum alloy layer of the aluminum substrate board was 30. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 6

A plate of 0.4 mm in thickness consisting of aluminum of 99.5% by weight and silicon of 0.5% by weight was laminated on each of both side surfaces of aluminum nitride substrate board of 0.635 mm in thickness through a brazing material layer of 50 μ in thickness consisting of aluminum of 87.5% by weight and silicon of 12.5% by weight. Then, the plate was inserted into a furnace heated at 640° C. As a result, a metal-ceramic substrate board was formed of an aluminum alloy plate and aluminum nitride. The Vickers hardness of the aluminum alloy layer of the substrate board was 31. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 7

A metal-ceramic substrate board was farmed under the same condition as in the example 1 except that the composition of the raw material 11 was formed of alumimum of 97.9% by weight, silicon of 0.6% by weiht, and Mn of 1.5% by weight. The Vickers hardness of the aluminum alloy layer of the aluminum substrate board was 32. Then, a power module was formed by combining the metal-ceramic substrate board with a base plate of Al—SiC composite material by using a brazing material of eutectic composition. Here, Mn was used to increase the hardness.

A thermal cycle test was performed to evaluate the power module. After the thermal cycle of 3000 times, no change was recognized in the ceramics and the brazing material layer between the ceramics and the base plate.

EXAMPLE 8

A metal-ceramic substrate board was formed under the same condition as in the example 6 except that the laminated plate was formed of aluminum of 98.6% by weight, silicon of 0.4% by weight, and Mg of 1% by weight. The Vickers hardness of the aluminum alloy layer of the aluminum substrate board was 30. Then, a power module was formed by combining the metal-ceramic substrate board with a base plate of Al—SiC composite material by using a brazing material of eutectic composition. Here, Mg was used to increase the hardness.

A thermal cycle test was performed to evaluate the power module. After the thermal cycle of 3000 times, no change was recognized in the ceramics and the brazing material layer between the ceramics and the base plate.

EXAMPLE 9

A metal-ceramic substrate board was formed under the same condition as in the example 1 except that the composition of the raw material 11 was formed of aluminum of 98% by weight and Mn of 2% by weight. The Vickers hardness of the aluminum alloy layer of the aluminum substrate board was 30. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 10

A metal-ceramic substrate board was formed under the same condition as in the example 1 except that the composition of the raw material 11 was formed of aluminum of 99.8 by weight and Mn of 0.2% by weight. The Vickers hardness of the aluminum alloy layer of the aluminum substrate board was 25. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 11

A metal-ceramic substrate board was formed under the same condition as in the example 1 except that the composition of the raw material 11 was formed of aluminum of 99.5% by weight, and Mn of 0.5% by weight. The Vickers hardness of the aluminum alloy layer of the aluminum substrate board was 27. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 12

A metal-ceramic substrate board was formed under the same condition as in the example 11 except that alumina was used as the ceramics. The Vickers hardness of the aluminum alloy layer of the substrate board was 27. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 13

A metal-ceramic substrate board was formed under the same condition as in the example 11 except that silicon nitride was used as the ceramics. The Vickers hardness of the aluminum alloy layer of the aluminum substrate board was 27. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 14

A metal-ceramic substrate board was formed under the same condition as in the example 1 except that the composition of the raw material 11 was formed of aluminum of 99.0% by weight, and Cu of 1% by weight. The Vickers hardness of the aluminum alloy layer of the aluminum substrate board was 30. Then, a power module was formed by combining the metal-ceramic substrate board with a base plate of Al—SiC composite material by using a brazing material of eutectic composition.

EXAMPLE 15

A metal-ceramic substrate board was formed under the same condition as in the example 1 except that the composition of the raw material 11 was formed of aluminum of 98% by weight, and Cu of 2% by weight. The Vickers hardness of the aluminum alloy layer of the aluminum substrate board was 32. Then, a power module was formed by combining the metal-ceramic substrate board with a base plate of Al—SiC composite material by using a brazing material of eutectic composition.

EXAMPLE 16

A metal-ceramic substrate board was formed under the same condition as in the example 15 except that alumina was used as the ceramics. The Vickers hardness of the aluminum alloy layer of the substrate board was 32. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 17

A metal-ceramic substrate board was formed under the same condition as in the example 15 except that silicon nitride was used as the ceramics. The Vickers hardness of the aluminum alloy layer of the aluminum substrate board was 32. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 18

A metal-ceramic substrate board was formed under the same condition as in the example 1 except that the composition of the raw material 11 was formed of aluminum of 98% by weight and Zn of 2% by weight. The Vickers hardness of the aluminum alloy layer of the aluminum substrate board was 34. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 19

A metal-ceramic substrate board was formed under the same condition as in the example 1 except that the composition of the raw material 11 was formed of aluminum of 99.5% by weight and Ni of 0.5% by weight. The Vickers hardness of the aluminum alloy layer of the aluminum substrate board was 33. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 20

A plate of 0.4 mm in thickness consisting of aluminum of 98% by weight and Mn of 2% by weight was laminated on each of both side surfaces of aluminum nitride substrate board of 0.635 mm in thickness through a brazing material layer of 50µ in thickness consisting of aluminum of 87.5% by weight and silicon of 12.5% by weight. Then, the plate was inserted into a furnace heated at 640° C. As a result, a metal-ceramic substrate board was formed of an aluminum alloy plate and aluminum nitride. The Vickers hardness of the aluminum alloy layer of the substrate board was 25. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 21

A metal-ceramic substrate board was formed under the same condition as in the example 20 except that the laminated plate was formed of aluminum of 99.8% by weight, and Mg of 0.2% by weight. The Vickers hardness of the aluminum alloy layer of the aluminum substrate board was 25. Then, a power module was formed by combining the metal-ceramic substrate board with a base plate of Al—SiC composite material by using a brazing material of eutectic composition. Here, Mg was used to increase the hardness.

A thermal cycle test was performed to evaluate the power module. After the thermal cycle of 3000 times, no change was recognized in the ceramics and the brazing material layer between the ceramics and the base plate.

EXAMPLE 22

A metal-ceramic substrate board was formed under the same condition as in the example 20 except that the laminated plate was formed of aluminum of 99.5% by weight, and Mg of 0.5% by weight. The Vickers hardness of the aluminum alloy layer of the aluminum substrate board was 27. Then, a power module was formed by combining the metal-ceramic substrate board with a base plate of Al—SiC composite material by using a brazing material of eutectic composition. Here, Mg was used to increase the hardness.

A thermal cycle test was performed to evaluate the power module. After the thermal cycle of 3000 times, no change was recognized in the ceramics and the brazing material layer between the ceramics and the base plate.

EXAMPLE 23

A metal-ceramic substrate board was formed under the same condition as in the example 22 except that alumina was used as the ceramics. The Vickers hardness of the aluminum alloy layer of the substrate board was 27. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 24

A metal-ceramic substrate board was fanned under the same condition as in the example 22 except tat silicon nitride was used as the ceramics. The Vickers hardness of the aluminum alloy layer of the aluminum substrate board was 27. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 25

A metal-ceramic substrate board was formed under the same condition as in the example 20 except that the composition of the raw material 11 was formed of aluminum of 99.0% by weight, and Cu of 1% by weight. The Vickers hardness of the aluminum alloy layer of the aluminum substrate board was 31. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 26

A metal-ceramic substrate board was formed under the same condition as in the example 20 except that the composition of the raw material 11 was formed of aluminum of 98% by weight, and Cu of 2% by weight. The Vickers hardness of the aluminum alloy layer of the aluminum substrate board was 33. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 27

A metal-ceramic substrate board was formed under the same condition as in the example 26 except that alumina was used as the ceramics. The Vickers hardness of the aluminum alloy layer of the substrate board was 33. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 28

A metal-ceramic substrate board was formed under the same condition as in to example 26 except that silicon nitride was used as the ceramics. The Vickers hardness of the aluminum alloy layer of the aluminum substrate board was 33. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 29

A metal-ceramic substrate board was formed under the same condition as in the example 20 except that the composition of the raw material 11 was formed of aluminum of 98% by weight, and Zn of 2% by weight. The Vickers hardness of the aluminum alloy layer of the aluminum substrate board was 35. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 30

A metal-ceramic substrate board was formed under the same condition as in the example 20 except that the composition of the raw material 11 was formed of aluminum of 99.5% by weight, and Ni of 1% by weight. The Vickers hardness of the aluminum alloy layer of the aluminum substrate board was 33. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 31

A metal-ceramic substrate board was formed under the same condition as in the example 1 except that the composition of the raw material 11 was formed of aluminum of 99.4% by weight silicon of 0.1% by weight, and Mg of 0.5% by weight. The Vickers hardness of the aluminum alloy layer of the aluminum substrate board was 28. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 32

A plate of 0.4 mm in thickness consisting of aluminum of 99.4% by weight, Mg of 0.5% by weight and silicon of 0.1% by weight was laminated on each of both side surfaces of aluminum nitride substrate board of 0.635 mm in thickness through a brazing material layer of 50µ in thickness consisting of aluminum of 87.5% by weight and silicon of 12.5% by weight. Then, the plate was inserted into a furnace heated at 640° C. As a result, a metal-ceramic substrate board was formed of an aluminum alloy plate and aluminum nitride. The Vickers hardness of the aluminum alloy layer of the substrate board was 28. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 33

A metal-ceramic substrate board was formed under the same condition as in the example 31 except that the laminated plate was formed of aluminum of 98.9% by weight, silicon of 0.1% by weight, and Cu of 1% by weight. The Vickers hardness of the aluminum alloy layer of the aluminum substrate board was 32. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 34

A metal-ceramic substrate board was formed under the same condition as in the example 32 except that the laminated plate was formed of aluminum of 98.9% by weight, silicon of 0.1% by weight, and Cu of 1% by weight. The Vickers hardness of the aluminum alloy layer of the aluminum substrate board was 32. Then, a power module was formed by combining the metal-ceramic substrate board with a base plate of Al—SiC composite material by using a brazing material of eutectic composition.

A thermal cycle test was performed to evaluate the power module. After the thermal cycle of 3000 times, no change was recognized in the ceramics and the brazing material layer between the ceramics and the base plate.

EXAMPLE 35

A metal-ceramic substrate board was formed under the same condition as in the example 31 except that the laminated plate was Conned of aluminum of 98.8% by weight, silicon of 0.1% by weight, Cu of 1% by weight, and Mg of 0.1% by weight. The Vickers hardness of the aluminum alloy layer of the aluminum substrate board was 33. Then, a power module was formed by combining the metal-ceramic substrate board with a base plate of Al—SiC composite material by using a brazing material of eutectic composition. Here, Mg was used to increase the hardness.

A thermal cycle test was performed to evaluate the power module. After the thermal cycle of 3000 times, no change was recognized in the ceramics and the brazing material layer between the ceramics and the base plate.

EXAMPLE 36

A metal-ceramic substrate board was formed under the same condition as in the example 32 except that the laminated plate was formed of aluminum of 98.8% by weight, silicon of 0.1% by weight, Cu of 1% by weight, and Mg of 0.1% by weight. The Vickers hardness of the aluminum alloy layer of the aluminum substrate board was 33. Then, a power module was formed by combining the metal-ceramic substrate board with a base plate of Al—SiC composite material by using a brazing material of eutectic composition. Here, Mg was used to increase the hardness.

A thermal cycle test was performed to evaluate the power module. After the thermal cycle of 3000 times, no change was recognized in the ceramics and the brazing material layer between the ceramics and the base plate.

COMPARATIVE EXAMPLE 1

A following sample was prepared for comparison. As shown in FIG. 2, a raw material 11 of aluminum of 100% by weight and a piston 12 of graphite were set in a concave portion 10 formed at an upper portion of a crucible 9 of graphite. A ceramic substrate board 14 of aluminum nitride of 0.635 mm in thickness was set in a cavity 13 formed at a lower portion of the crucible 9 of graphite. Then, crucible 9 was inserted into a furnace heated at 800° C. As a result, the raw material was molten and pushed out by the weight of the piston 12 into the cavity 13 including therein the ceramic substrate board 14. The crucible 9 was taken out of the furnace and cooled at a room temperature. In this comparative example 1, the heating and cooling of the crucible 9 were performed in an atmosphere of nitrogen gas in order to prevent the crucible 9 from being oxidized. Thus obtained ceramic substrate board 14 having at each of side surfaces thereof an aluminum alloy layer of 0.5 mm in thickness was subjected to the mechanical and electrolytic polishing.

The Vickers hardness of the aluminum alloy layer of the substrate board was 20. Then, a power module was formed by combining the metal-ceramic substrate board with a base plate of Al—SiC composite material by using a brazing material of eutectic composition.

A thermal cycle test was performed to evaluate the power module. After the thermal cycle of 2000 times, small cracks were recognized in the brazing material layer between the ceramics and the base plate. However, the function of the module was not reduced.

COMPARATIVE EXAMPLE 2

A metal-ceramic substrate board was formed under the same condition as in the comparative example 1 except that the composition of the raw material 11 was formed of aluminum of 95% by weight and silicon of 5% by weight The Vickers hardness of the aluminum alloy layer of the aluminum substrate board was 40. Then, a power module was formed by combining the metal-ceramic substrate board with a base plate of Al—SiC composite material by using a brazing material of eutectic composition.

A thermal cycle test was performed to evaluate the power module. After the thermal cycle of 1000 times, cracks were recognized in the ceramics.

COMPARATIVE EXAMPLE 3

A plate of 0.4 mm in thickness consisting of aluminum of 95% by weight and silicon of 5% by weight was laminated on each of both side surfaces of aluminum nitride substrate board of 0.635 mm in thickness through a brazing material layer of 50μ in thickness consisting of aluminum of 87.5% by weight and silicon of 12.5% by weight. Then, the plate was inserted into a furnace heated at 640° C. As a result, a metal-ceramic substrate board was formed of an aluminum alloy plate and aluminum nitride. The Vickers hardness of the aluminum alloy layer of the substrate board was 40. Then, a power module was formed by combining the metal-ceramic substrate board with a base plate of Al—SiC composite material by using a brazing material of eutectic composition.

A thermal cycle test was performed to evaluate the power module. After the thermal cycle of 1000 times, cracks were recognized in the ceramics.

COMPARATIVE EXAMPLE 4

A metal-ceramic substrate board was formed under the same condition as in the comparative example 1 except that the composition of the raw material 11 was formed of aluminum of 95% by weight and Ni of 5% by weight. The Vickers hardness of the aluminum alloy layer of the aluminum substrate board was 42. Then, a power module was formed by combining the metal-ceramic substrate board with a base plate of Al—SiC composite material by using a brazing material of eutectic composition.

A thermal cycle test was performed to evaluate the power module. After the thermal cycle of 1000 times, cracks were recognized in the ceramics. However, after the thermal cycle of 1000 times, no crack was recognized in the brazing material layer between the ceramics and the base plate.

COMPARATIVE EXAMPLE 5

A metal-ceramic substrate board was formed under the same condition as in the comparative example 1 except that the composition of the raw material 11 was formed of aluminum of 95% by weight and Cu of 5% by weight. The Vickers hardness of the aluminum alloy layer of the aluminum substrate board was 68. Then, a power module was formed by combining the metal-ceramic substrate board with a base plate of Al—SiC composite material by using a brazing material of eutectic composition.

A thermal cycle test was performed to evaluate the power module. After the thermal cycle of 100 times, cracks were recognized in the ceramics. However, after the thermal cycle of 100 times, no crack was recognized in the brazing material layer between the ceramics and the base plate.

COMPARATIVE EXAMPLE 6

A metal-ceramic substrate board was formed under the same condition as in the comparative example 1 except that the composition of the raw material 11 was formed of aluminum of 98% by weight and Mg of 2% by weight. The Vickers hardness of the aluminum alloy layer of the aluminum substrate board was 67. Then, a power module was formed by combining the metal-ceramic substrate board with a base plate of Al—SiC composite material by using a brazing material of eutectic composition.

A thermal cycle test was performed to evaluate the power module. After the thermal cycle of 100 times, cracks were recognized in the ceramics. However, after the thermal cycle of 100 times, no crack was recognized in the brazing material layer between the ceramics and the base plate.

COMPARATIVE EXAMPLE 7

A metal-ceramic substrate board was formed under the same condition as in the comparative example 1 except that the composition of the raw material 11 was formed of aluminum of 95% by weight and Zn of 5% by weight. The Vickers hardness of the aluminum alloy layer of the aluminum substrate board was 40. Then, a power module was formed by combining the metal-ceramic substrate board with a base plate of Al—SiC composite material by using a brazing material of eutectic composition.

A thermal cycle test was performed to evaluate the power module. After the thermal cycle of 1000 times, cracks were recognized in the ceramics. However, after the thermal cycle of 1000 times, no crack was recognized in the brazing material layer between the ceramics and the base plate.

COMPARATIVE EXAMPLE 8

A metal-ceramic substrate board was formed under the same condition as in the comparative example 3 except that the composition of the raw material 11 was formed of aluminum of 95% by weight and Cu of 5% by weight. The Vickers hardness of the aluminum alloy layer of the aluminum substrate board was 68. Then, a power module was formed by combining the metal-ceramic substrate board with a base plate of Al—SiC composite material by using a brazing material of eutectic composition.

A thermal cycle test was performed to evaluate the power module. After the thermal cycle of 100 times, cracks were recognized in the ceramics. However, after the thermal cycle of 100 times, no crack was recognized in the brazing material layer between the ceramics and the base plate.

COMPARATIVE EXAMPLE 9

A metal-ceramic substrate board was formed under the same condition as in the comparative example 3 except that the composition of the raw material 11 was formed of aluminum of 98% by weight and Mg of 2% by weight. The Vickers hardness of the aluminum alloy layer of the aluminum substrate board was 67. Then, a power module was formed by combining the metal-ceramic substrate board with a base plate of Al—SiC composite material by using a brazing material of eutectic composition.

A thermal cycle test was performed to evaluate the power module. After the thermal cycle of 100 times, cracks were recognized in the ceramics. However, after the thermal cycle of 100 times, no crack was recognized in the brazing material layer between the ceramics and the base plate.

COMPARATIVE EXAMPLE 10

A metal-ceramic substrate board was formed under the same condition as in the comparative example 1 except that the composition of the raw material 11 was formed of aluminum of 99.9% by weight and Cu of 0.1% by weight. The Vickers hardness of the aluminum alloy layer of the aluminum substrate board was 22. Then, a power module was formed by combining the metal-ceramic substrate board with a base plate of Al—SiC composite material by using a brazing material of eutectic composition.

A thermal cycle test was performed to evaluate the power module. After the thermal cycle of 2000 times, cracks were recognized in the ceramics. However, after the thermal cycle of 2000 times, no crack was recognized in the brazing material layer between the ceramics and the base plate.

TABLE 1

|  | Example 1 | Example 2 | Example 3 | Example 4 | Example 5 | Example 6 |
|---|---|---|---|---|---|---|
| Vickers hardness | 25 | 30 | 35 | 30 | 30 | 31 |
| composition of aluminum | Al 99.8% Si 0.2% | Al 99.5% Si 0.5% | Al 98% Si 2% | Al 99.5% Si 0.5% | Al 99.5% Si 0.5% | Al 99.5% Si 0.5% |
| ceramics | aluminum nitride | aluminum nitride | aluminum nitride | alumina | silicon nitride | aluminum nitride |
| manner of bond | direct bonding | direct bonding | direct bonding | direct bonding | direct bonding | bonding by brazing |
| thermal cycle resistance | more than 3000 cycle | more than 3000 cycle | more than 3000 cycle | more than 3000 cycle | more than 3000 cycle | more than 3000 cycle |
| crack in ceramics | no crack at 3000 cycle | no crack at 3000 cycle | no crack at 3000 cycle | no crack at 3000 cycle | no crack at 3000 cycle | no crack at 3000 cycle |
| crack in brazing material | no crack at 3000 cycle | no crack at 3000 cycle | no crack at 3000 cycle | no crack at 3000 cycle | no crack at 3000 cycle | no crack at 3000 cycle |

|  | Example 7 | Example 8 | Example 9 | Example 10 |
|---|---|---|---|---|
| Vickers hardness | 32 | 30 | 30 | 25 |
| composition of aluminum | Al 97.9% Si 0.6% Mn 1.5% | Al 98.6% Si 0.4% Mg 1% | Al 98% Mn 2% | Al 99.8% Mg 0.2% |
| ceramics | aluminum nitride | aluminum nitride | aluminum nitride | aluminum nitride |
| manner of bond | direct bonding | bonding by brazing | direct bonding | direct bonding |
| thermal cycle resistance | more than 3000 cycle | more than 3000 cycle | more than 3000 cycle | more than 3000 cycle |
| crack in ceramics | no crack at 3000 cycle | no crack at 3000 cycle | no crack at 3000 cycle | no crack at 3000 cycle |
| crack in brazing material | no crack at 3000 cycle | no crack at 3000 cycle | no crack at 3000 cycle | no crack at 3000 cycle |

TABLE 2

|  | Example 11 | Example 12 | Example 13 | Example 14 | Example 15 | Example 16 |
|---|---|---|---|---|---|---|
| Vickers hardness | 27 | 27 | 27 | 30 | 32 | 32 |
| composition of aluminum | Al 99.5% Mg 0.5% | Al 99.5% Mg 0.5% | Al 99.5% Mg 0.5% | Al 99% Cu 1% | Al 98% Cu 2% | Al 98% Cu 2% |
| ceramics | aluminum nitride | alumina | silicon nitride | aluminum nitride | aluminum nitride | alumina |
| manner of bond | direct bonding | direct bonding | direct bonding | direct bonding | direct bonding | direct bonding |
| thermal cycle resistance | more than 3000 cycle | more than 3000 cycle | more than 3000 cycle | more than 3000 cycle | more than 3000 cycle | more than 3000 cycle |
| crack in ceramics | no crack at 3000 cycle | no crack at 3000 cycle | no crack at 3000 cycle | no crack at 3000 cycle | no crack at 3000 cycle | no crack at 3000 cycle |
| crack in brazing material | no crack at 3000 cycle | no crack at 3000 cycle | no crack at 3000 cycle | no crack at 3000 cycle | no crack at 3000 cycle | no crack at 3000 cycle |

|  | Example 17 | Example 18 | Example 19 | Example 20 |
|---|---|---|---|---|
| Vickers hardness | 32 | 34 | 33 | 31 |
| composition of aluminum | Al 98% Cu 2% | Al 98% Zn 2% | Al 99.5% Ni 0.5% | Al 98% Mn 2% |
| ceramics | silicon nitride | aluminum nitride | aluminum nitride | aluminum nitride |
| manner of bond | direct bonding | direct bonding | direct bonding | bonding by brazing |
| thermal cycle resistance | more than 3000 cycle | more than 3000 cycle | more than 3000 cycle | more than 3000 cycle |
| crack in ceramics | no crack at 3000 cycle | no crack at 3000 cycle | no crack at 3000 cycle | no crack at 3000 cycle |
| crack in brazing material | no crack at 3000 cycle | no crack at 3000 cycle | no crack at 3000 cycle | no crack at 3000 cycle |

TABLE 3

|  | Example 21 | Example 22 | Example 23 | Example 24 | Example 25 | Example 26 |
|---|---|---|---|---|---|---|
| Vickers hardness | 25 | 27 | 27 | 27 | 31 | 33 |
| composition of aluminum | Al 99.8% Mn 0.2% | Al 99.5% Mn 0.5% | Al 99.5% Mn 0.5% | Al 99.5% Mn 0.5% | Al 99% Cu 1% | Al 98% Cu 2% |
| ceramics | aluminum nitride | aluminum nitride | alumina | silicon nitride | aluminum nitride | aluminum nitride |
| manner of bond | bonding by brazing | bonding by brazing | bonding by brazing | bonding by brazing | bonding by brazing | bonding by brazing |
| thermal cycle resistance | more than 3000 cycle | more than 3000 cycle | more than 3000 cycle | more than 3000 cycle | more than 3000 cycle | more than 3000 cycle |
| crack in ceramics | no crack at 3000 cycle | no crack at 3000 cycle | no crack at 3000 cycle | no crack at 3000 cycle | no crack at 3000 cycle | no crack at 3000 cycle |
| crack in brazing material | no crack at 3000 cycle | no crack at 3000 cycle | no crack at 3000 cycle | no crack at 3000 cycle | no crack at 3000 cycle | no crack at 300 cycle |

|  | Example 27 | Example 28 | Example 29 | Example 30 |
|---|---|---|---|---|
| Vickers hardness | 33 | 33 | 35 | 33 |
| composition of aluminum | Al 98% Cu 2% | Al 98% Cu 2% | Al 98% Zn 2% | Al 99.5% Ni 0.5% |
| ceramics | alumina | silicon nitride | aluminum nitride | aluminum nitride |
| manner of bond | bonding by brazing | bonding by brazing | bonding by brazing | bonding by brazing |
| thermal cycle resistance | more than 3000 cycle | more than 3000 cycle | more than 3000 cycle | more than 3000 cycle |
| crack in ceramics | no crack at 3000 cycle | no crack at 3000 cycle | no crack at 3000 cycle | no crack at 3000 cycle |
| crack in brazing material | no crack at 3000 cycle | no crack at 3000 cycle | no crack at 3000 cycle | no crack at 3000 cycle |

TABLE 4

|  | Example 31 | Example 32 | Example 33 | Example 34 | Example 35 | Example 36 |
|---|---|---|---|---|---|---|
| Vickers hardness | 28 | 28 | 32 | 32 | 33 | 33 |
| composition of aluminum | Al 99.4% Si 0.1% Mg 0.5% | Al 99.4% Si 0.1% Mg 0.5% | Al 98.9% Si 0.1% Cu 1% | Al 98.8% Si 0.1% Cu 1% | Al 98.8% Si 0.1% Mg 0.1% Cu 1% | Al 98.8% Si 0.1% Mg 0.1% Cu 1% |
| ceramics | aluminum nitride | aluminum nitride | aluminum nitride | aluminum nitride | aluminum nitride | aluminum nitride |
| manner of bond | direct bonding | bonding by brazing | direct bonding | bonding by brazing | direct bonding | bonding by brazing |
| thermal cycle resistance | more than 3000 cycle | more than 3000 cycle | more than 3000 cycle | more than 3000 cycle | more than 3000 cycle | more than 3000 cycle |
| crack in ceramics | no crack at 3000 cycle | no crack at 3000 cycle | no crack at 3000 cycle | no crack at 3000 cycle | no crack at 3000 cycle | no crack at 3000 cycle |
| crack in brazing material | no crack at 3000 cycle | no crack at 3000 cycle | no crack at 3000 cycle | no crack at 3000 cycle | no crack at 3000 cycle | no crack at 3000 cycle |

TABLE 5

|  | Comparative Example 1 | Comparative Example 2 | Comparative Example 3 | Comparative Example 4 | Comparative Example 5 | Comparative Example 6 |
|---|---|---|---|---|---|---|
| Vickers hardness | 20 | 40 | 40 | 42 | 68 | 67 |
| composition of aluminum | Al 100% | Al 95% Si 5% | Al 95% Si 5% | Al 95% Ni 5% | Al 95% Cu 5% | Al 98% Mg 2% |
| ceramics | aluminum nitride | aluminum nitride | aluminum nitride | aluminum nitride | aluminum nitride | aluminum nitride |
| manner of bond | direct bonding | direct bonding | bonding by brazing | direct bonding | direct bonding | direct bonding |
| thermal cycle resistance | 2000 cycle | 1000 cycle | 1000 cycle | 1000 cycle | 100 cycle | 100 cycle |
| crack in ceramics | no crack at 2000 cycle | crack at 1000 cycle | crack at 1000 cycle | crack at 1000 cycle | crack at 100 cycle | crack at 100 cycle |
| crack in brazing material | crack a little at 2000 cycle | no crack at 1000 cycle | no crack at 1000 cycle | no crack at 1000 cycle | no crack at 100 cycle | no crack at 100 cycle |

TABLE 5-continued

|  | Comparative Example 7 | Comparative Example 8 | Comparative Example 9 | Comparative Example 10 |
|---|---|---|---|---|
| Vickers hardness | 40 | 68 | 67 | 22 |
| composition of aluminum | Al 95% Zn 5% | Al 95% Cu 5% | Al 98% Mg 2% | Al 99.9% Cu 0.1% |
| ceramics | aluminum nitride | aluminum nitride | aluminum nitride | aluminum nitride |
| manner of bond | direct bonding | bonding by brazing | bonding by brazing | direct bonding |
| thermal cycle resistance | 1000 cycle | 100 cycle | 100 cycle | 2000 cycle |
| crack in ceramics | crack at 1000 cycle | crack at 100 cycle | crack at 100 cycle | crack at 2000 cycle |
| crack in brazing material | no crack at 1000 cycle | no crack at 100 cycle | no crack at 100 cycle | no crack at 2000 cycle |

According to the power module of the present invention, as stated above, a high reliability and a high thermal-cycle resistance can be obtained, and the ceramics can be protected from the thermal shock and cracks are prevented from being formed in the brazing material, by setting the hardness of the aluminum of the aluminum-ceramics insulating substrate board in a predetermined range.

Au plating or Ni plating may be carried out on the ceramic substrate board in order to increase the corrosion resistance and the affinity for the brazing material.

Aluminum among the ceramics has a high heat insulating ability and is cheap. The aluminum nitride has a high heat conductivity and a high heat radiation, so that it is preferable to hold heavy current control tip. The silicon nitride has a high strength and a high thermal cycle resistance, so that it can be used in the hard circumstances, such as in the engine room.

Further, the Vickers hardness of the aluminum surface was measured with respect to the ceramics bonded with a weight of 50 g for 15 seconds to aluminum by using a micro-Vickers hardness meter (MVK-G1 made of Kabushiki Kaisya Mei Seki Sha). The values of the Vickers hardness in the Table 1 are average values obtained at twenty portions. The thermal cycle test was carried out in the gaseous phase and one cycle thereof was that the temperature of −40° C. was maintained for 30 minutes, 25° C. was maintained for 10 minutes, 125° C. was maintained for 30 minutes, 25° C. was maintained for 10 minutes and then −40° C. was maintained for 30 minutes.

While the invention has been particularly shown and described with reference to the preferred embodiments thereof, it will be understood by those skilled in the art that various changes in form and details may be made therein without departing from the spirit and scope of the invention as defined by the appended claims.

What is claimed is:

1. An insulating substrate board for a semiconductor comprising:
   a ceramic substrate board; and
   a metal alloy layer consisting essentially of aluminum of not less than 98% by weight and of silicon of not less than 0.2% by weight and not more than 0.5% by weight,
   wherein the metal alloy layer is bonded on at least one surface portion of the ceramic substrate board, and wherein a Vickers hardness of the metal alloy layer is not less than 25 and not more than 35.

2. The insulating substrate board according to claim 1, wherein the metal alloy layer is bonded on at least one surface portion of the ceramic substrate board by direct bonding.

3. The insulating substrate board according to claim 1, wherein the metal alloy layer is bonded on at least one surface portion of the ceramic substrate board through a brazing material layer.

4. An insulating substrate board for a semiconductor comprising:
   a ceramic substrate board; and
   a metal alloy layer consisting essentially of aluminum, silicon of about 0.6% by weight, and Mn of about 1.5% by weight.
   wherein the metal alloy layer is bonded by direct bonding on at least one surface portion of the ceramic substrate board, and wherein a Vickers hardness of the metal alloy layer is not less than 25 and not more than 35.

5. An insulating substrate board for a semiconductor comprising:
   a ceramic substrate board; and
   a metal alloy layer consisting essentially of aluminum, silicon of not less than 0.1% by weight and not more than 0.4% by weight, and Mg of not less than 0.5% by weight and not more than 1% by weight,
   wherein the metal alloy layer is bonded on at least one surface portion of the ceramic substrate board, and wherein a Vickers hardness of the metal alloy layer is not less than 25 and not more than 35.

6. The insulating substrate board according to claim 5, wherein the metal alloy layer is bonded on at least one surface portion of the ceramic substrate board by direct bonding.

7. The insulating substrate board according to claim 5, wherein the metal alloy layer is bonded on at least one surface portion of the ceramic substrate board through a brazing material layer.

8. An insulating substrate board for a semiconductor comprising:
   a ceramic substrate board; and
   a metal alloy layer consisting essentially of aluminum and of Cu of not less than 1.0% by weight and not more than 2.0% by weight,
   wherein the metal alloy layer is bonded on at least one surface portion of the ceramic substrate board, and wherein a Vickers hardness of the metal alloy layer is not less than 25 and not more than 35.

9. The insulating substrate board according to claim 8, wherein the metal alloy layer is bonded on at least one surface portion of the ceramic substrate board by direct bonding.

10. The insulating substrate board according to claim 8, wherein the metal alloy layer is bonded on at least one surface portion of the ceramic substrate board through a brazing material layer.

11. An insulating substrate board for a semiconductor comprising:
a ceramic substrate board; and
a metal alloy layer consisting essentially of aluminum and of Zn of about 2.0% by weight,
wherein the metal alloy layer is bonded on at least one surface portion of the ceramic substrate board, and wherein a Vickers hardness of the metal alloy layer is not less than 25 and not more than 35.

12. The insulating substrate board according to claim 11, wherein the metal alloy layer is bonded on at least one surface portion of the ceramic substrate board by direct bonding.

13. The insulating substrate board according to claim 11, wherein the metal alloy layer is bonded on at least one surface portion of the ceramic substrate board through a brazing material layer.

14. An insulating substrate board for a semiconductor comprising:
a ceramic substrate board; and
metal alloy layers consisting essentially of aluminum, silicon of about 0.1% by weight, and Cu of about 1.0% by weight,
wherein the metal alloy layer is bonded on at least one surface portion of the ceramic substrate board, and wherein a Vickers hardness of the metal alloy layer is not less than 25 and not more than 35.

15. The insulating substrate board according to claim 14, wherein the metal alloy layer is bonded on at least one surface portion of the ceramic substrate board by direct bonding.

16. The insulating substrate board according to claim 14, wherein the metal alloy layer is bonded on at least one surface portion of the ceramic substrate board through a brazing material layer.

17. An insulating substrate board for a semiconductor comprising:
a ceramic substrate board; and
a metal alloy layer consisting essentially of aluminum, Si of about 0.1% by weight, Cu of about 1.0% by weight, and Mg of about 0.1% by weight.
wherein the metal alloy layer is bonded on at least one surface portion of the ceramic substrate board, nd wherein a Vickers hardness of the metal alloy layer is not less than 25 and not more than 35.

18. The insulating substrate board according to claim 17, wherein the metal alloy layer is bonded on at least one surface portion of the ceramic substrate board by direct bonding.

19. The insulating substrate board according to claim 17, wherein the metal alloy layer is bonded on at least one surface portion of the ceramic substrate board through a brazing material layer.

20. A power module comprising:
a ceramic substrate board;
metal alloy layers consisting essentially of aluminum of not less than 98% by weight and of silicon of not less than 0.2% by weight and not more than 0.5% by weight, wherein the metal alloy layers are bonded on both surfaces of the ceramic substrate board;
a metal base plate bonded to one of the metal alloy layers; and
a semiconductor tip formed on the other of the metal alloy layer,
wherein a Vickers hardness of the metal alloy layer is not less than 25 and not more than 35.

21. The power module according to claim 20, wherein the metal alloy layers are bonded on the ceramic substrate board by direct bonding.

22. The power module according to claim 20, wherein the metal alloy layers are bonded on the ceramic substrate board through a brazing material layer.

23. A power module comprising:
a ceramic substrate board;
metal alloy layers consisting essentially of aluminum, silicon of about 0.6% by weight, and Mn of about 1.5% by weight, wherein the metal alloy layers are bonded on both surfaces of the ceramic substrate board;
a metal base plate bonded to one of the metal alloy layers; and
a semiconductor tip formed on the other of the metal alloy layer,
wherein a Vickers hardness of the metal alloy layer is not less than 25 and not more than 35.

24. A power module comprising:
a ceramic substrate board;
metal alloy layers consisting essentially of aluminum, silicon of not less than 0.1% by weight and not more than 0.4% by weight, and Mg of not less than 0.5% by weight and not more than 1% by weight, wherein the metal alloy layers are bonded on both surfaces of the ceramic substrate board;
a metal base plate bonded to one of the metal alloy layers; and
a semiconductor tip formed on the other of the metal alloy layer,
wherein a Vickers hardness of the metal alloy layer is not less than 25 and not more than 35.

25. The power module according to claim 24, wherein the metal alloy layers are bonded on the ceramic substrate board by direct bonding.

26. The power module according to claim 24, wherein the metal alloy layers are bonded on the ceramic substrate board through a brazing material layer.

27. A power module comprising:
a ceramic substrate board;
metal alloy layers consisting essentially of aluminum and of Cu of not less than 1.0% by weight and not more than 2.0% by weight, wherein the metal alloy layers are bonded on both surfaces of the ceramic substrate board;
a metal base plate bonded to one of the metal alloy layers; and
a semiconductor tip formed on the other of the metal alloy layer,
wherein a Vickers hardness of the metal alloy layer is not less than 25 and not more than 35.

28. The power module according to claim 27, wherein the metal alloy layers are bonded on the ceramic substrate board by direct bonding.

29. The power module according to claim 27, wherein the metal alloy layers are bonded on the ceramic substrate board through a brazing material layer.

30. A power module comprising:
a ceramic substrate board;

metal alloy layers consisting essentially of aluminum and of Zn of about 2.0% by weight, wherein the metal alloy layers are bonded on both surfaces of the ceramic substrate board;

a metal base plate bonded to one of the metal alloy layers; and a semiconductor tip formed on the other of the metal alloy layer, wherein a Vickers hardness of the metal alloy layer is not less than 25 and not more than 35.

31. The power module according to claim 30, wherein the metal alloy layers are bonded on the ceramic substrate board by direct bonding.

32. The power module according to claim 30, wherein the metal alloy layers are bonded on the ceramic substrate board through a brazing material layer.

33. A power module comprising:

a ceramic substrate board;

metal alloy layers consisting essentially of aluminum, silicon of about 0.1% by weight, and Cu of about 1.0% by weight, wherein the metal alloy layers are bonded on both surfaces of the ceramic substrate board;

a metal base plate bonded to one of the metal alloy layers; and a semiconductor tip formed on the other of the metal alloy layer, wherein a Vickers hardness of the metal alloy layer is not less than 25 and not more than 35.

34. The power module according to claim 33, wherein the metal alloy layers are bonded on the ceramic substrate board by direct bonding.

35. The power module according to claim 33, wherein the metal alloy layers are bonded on the ceramic substrate board through a brazing material layer.

36. A power module comprising:

a ceramic substrate board;

metal alloy layers consisting essentially of aluminum, Si of about 0.1% by weight, Cu of about 1.0% by weight, and Mg of about 0.1% by weight, wherein the metal alloy layers are bonded on both surfaces of the ceramic substrate board;

a metal base plate bonded to one of the metal alloy layers; and a semiconductor tip formed on the other of the metal alloy layer, wherein a Vickers hardness of the metal alloy layer is not less than 25 and not more than 35.

37. The power module according to claim 36, wherein the metal alloy layers are bonded on the ceramic substrate board by direct bonding.

38. The power module according to claim 37, wherein the metal alloy layers are bonded on the ceramic substrate board through a brazing material layer.

* * * * *